United States Patent [19]

Slough et al.

[11] Patent Number: 4,724,376
[45] Date of Patent: Feb. 9, 1988

[54] LOW VOLTAGE AC OHMETER

[75] Inventors: Carlton M. Slough, Spring; James H. Bluhm, Katy, both of Tex.

[73] Assignee: Texaco Inc., White Plains, N.Y.

[21] Appl. No.: 788,309

[22] Filed: Oct. 17, 1985

[51] Int. Cl.[4] ............... G01R 31/02; G01R 27/02
[52] U.S. Cl. .................................. 324/64; 324/65 R; 324/557
[58] Field of Search ............... 324/449, 220, 62, 54, 324/64, 65 R, 557

[56] References Cited

U.S. PATENT DOCUMENTS

| 3,784,906 | 1/1974 | Ironside | 324/62 R |
| 3,963,981 | 6/1976 | Vis | 324/62 R |
| 4,266,187 | 5/1981 | Slough | 324/449 |

OTHER PUBLICATIONS

Palm: "Three LEDS Display Response of Null Detector"–Electronics–Jun. 22, 1973, p. 150.

Primary Examiner—Reinhard J. Eisenzopf
Assistant Examiner—Jose M. Solis
Attorney, Agent, or Firm—Robert A. Kulason; James J. O'Loughlin; Robert B. Burns

[57] ABSTRACT

An AC ohmeter is adapted for testing insulated pipe flanges where flammable substances are involved. It employs a low frequency, low voltage oscillator and includes a precision rectifier. The output of the rectifier is smoothed and applied to a dual comparator circuit such that high, low and intermediate resistance readings are obtained.

2 Claims, 1 Drawing Figure

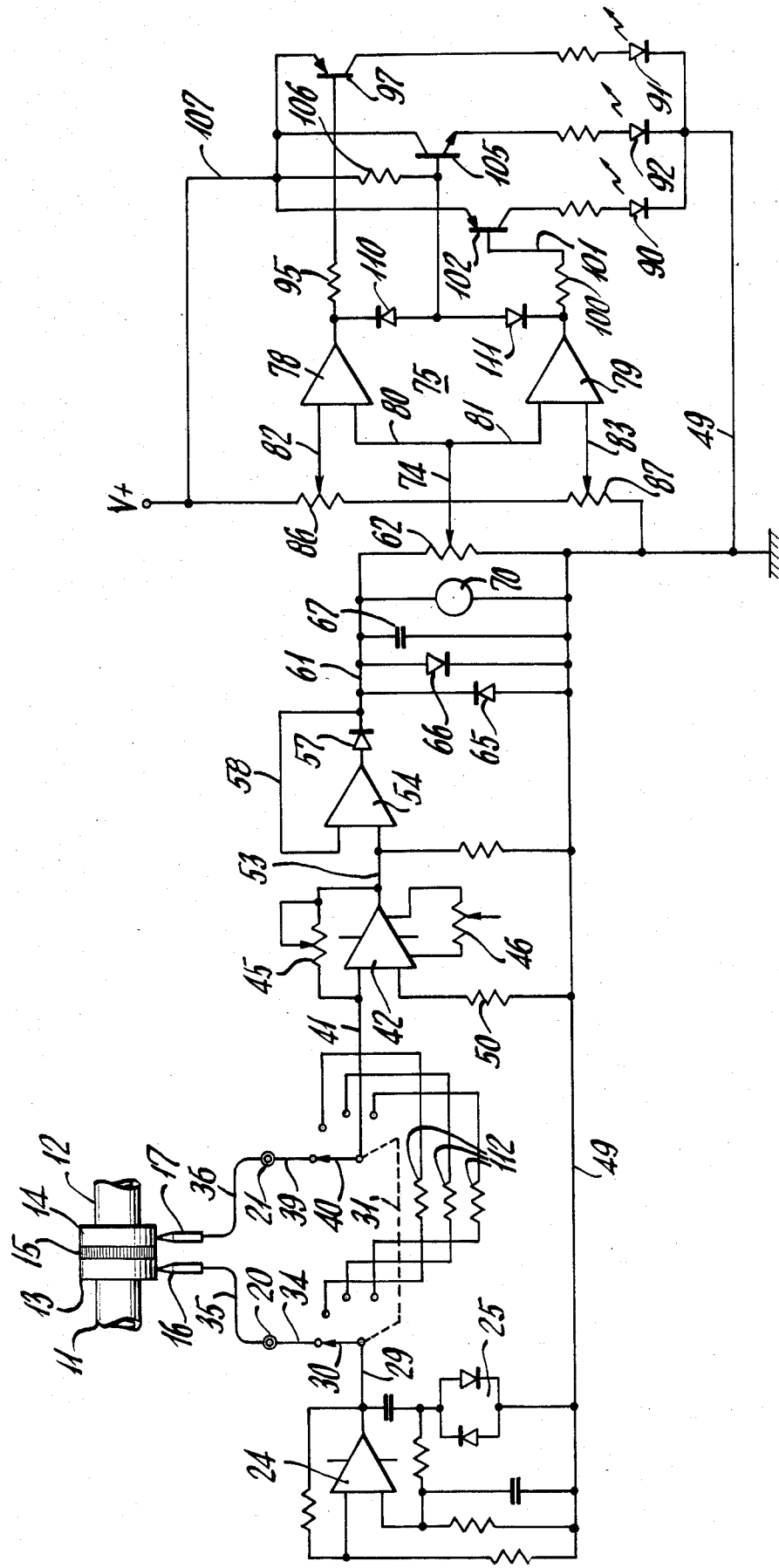

LOW VOLTAGE AC OHMETER

BACKGROUND OF THE INVENTION

This invention concerns a test instrument in general. More specifically, it relates to a low voltage AC ohmeter which is particularly applicable to testing insulated pipe flanges.

Insulated pipe flanges are required in many places where the handling of flammable substances are involved. The flanges with insulation perform a safety function by isolating ship and shore power systems at dock side. Similarly, pipelines are isolated from pump stations. Also, in refinery systems and in other places where flammable substances are being transported, isolations are called for. In such situations, there are safety regulations and codes which require the use of insulated flanges and which define the minimum allowable resistance across them. The regulations also specify the interval at which a flange must be tested.

In many of the foregoing installations, the nature of the fluids handled and the possibility of the accumulation of corrosion products, water, and debris across the flange insulator render it unacceptable to use a DC ohmeter. That is because polarization of such accumulation at the path being measured, can invalidate the information which is obtained. Furthermore, a standard so-called megger (AC ohmeter) will apply sufficient voltage across the flange insulator in the presence of flammables to present a possible fire hazard, and consequently is not suitable.

There are U.S. Pat. No. 3,987,390 dated Oct. 19, 1976, and U.S. Pat. No. 4,266,187 dated May 5, 1981 which are known to the applicant. However, the first of these makes use of a radio frequency signal that is applied to pipe flanges for making a resistance measurement. And, the half wave rectification detector and filter circuit that is employed uses a conventional rectifier so that the amplitude of the voltage employed must be sufficient to overcome the threshold value of such rectifier. Consequently, the safety factor for flammable substances is not provided.

The second of the foregoing patents discloses a test instrument that is particularly applicable to testing a corrosion inhibiting film. Consequently, it lacks applicability to insulated flange testing in accordance with the applicant's invention.

It is an object of this invention to provide a self-contained, portable, solid state, low voltage, AC ohmeter that is particularly applicable to testing insulated pipe flanges with safety requirements.

Another object of the invention is to provide a low voltage, AC ohmeter that includes high-low limits with visual readout so that the range of resistance value may be indicated to show the state of a flange insulator and indicate when replacement is called for, even before failure.

BRIEF SUMMARY OF THE INVENTION

The invention concerns a low voltage AC ohmeter for testing insulated pipe flanges in uses where flammable substances are handled. It comprises in combination a low frequency oscillator having a limiter for maintaining the output voltalge thereof less than a safe maximum, and probe circuit means for connecting said oscillator output in series with a pair of said pipe flanges to measure the resistance between said pipe flanges. It also comprises an amplifier having an input in series with said oscillator output and said probe circuit means and having an output, and a precision rectifier connected to said amplifier output. It also comprises a potentiometer connected across the output of said precision rectifier, and dual comparator means connected to the output of said petentiometer for determining the range of said resistance between pipe flanges.

Again briefly, the invention concerns a low voltage AC ohmeter for testing insulated pipe flanges in uses where flammable substances are handled. It comprises in combination a Wien bridge type oscillator having a frequency of about 1200 hertz and a limiter for maintaining the output voltage thereof less than one volt, and probe circuit means for connecting said oscillator output in series with a pair of said pipe flanges to measure the resistance between said pair of flanges. It also comprises an amplifier having an input in series with said probe circuit means and an output, and a precision rectifier connected to said amplifier output for reducing the threshold amplitude of rectified output signals. It also comprises a potentiometer connected across the output of said precision rectifier, and a smoothing and surge limiting circuit connected across the output of said precision rectifier in parallel with said potentiometer. It also comprises a microammeter connected in parallel with said smoothing and surge limiting circuit for indicating the resistance between said pipe flanges, and dual comparator means connected to said potentiometer. The said dual comparator means comprises a pair of comparators, and a pair of light emitting diodes having different colors. The dual comparator means also comprises a first circuit means for connecting one of said light emitting diodes to each of said pair of comparators, and a third light emitting diode having a color different from said pair of light emitting diodes. The dual comparator means also comprises second circuit means for connecting said third light emitting diode to both said comparators whereby said dual comparator means indicates one of three ranges of the resistance between said pipe flanges. The low voltage AC ohmeter also comprises three calibration resistors for providing predetermined resistances in place of said pair of pipe flanges, and circuit means for alternatively connecting one of said calibration resistors in place of said probe circuit means to test said dual comparator means including said light emitting diodes.

BRIEF DESCRIPTION OF THE DRAWING

The foregoing and other objects and benefits of the invention will be more fully set forth below in connection with the best mode contemplated by the inventors of carrying out the invention, and in connection with which there are illustrations provided in the drawing, wherein:

The FIGURE of drawing is a schematic circuit diagram illustrating the elements of a test instrument according to the invention as applied to testing insulated pipe flanges.

A test instrument according to this invention is able to satisfy the needs of the foregoing indicated safety regulations and code requirements since it may be constructed as a self contained, portable, solid state, low voltage, AC ohmeter. Furthermore, it includes precision reference resistors which allow the instrument integrity to be checked at each use, and it also contains built-in high-low limits with a visual readout for indicating the ranges measured.

The drawing FIGURE illustrates a circuit diagram of an instrument according to the invention. It indicates schematically the application of the instrument to measurement of the resistance across insulated pipe flanges. Thus, there is schematically indicated a pipe 11 that is coupled to another pipe 12 via flanges 13 and 14 respectively, which have (as indicated) an insulator 15 therebetween. Insulator 15 provides the safety function of isolating the aforementioned ship and shore power systems at a dock side, or the pump station and refinery systems isolations.

It will be understood that the test instrument might take various physical forms. In an event, there will be provided the usual adaptability for connecting a pair of probes 16 and 17 to the instrument, e.g. by means of a pair of connector plugs 20 and 21 illustrated.

The instrument may best be dscribed by a preferred embodiment that is illustrated in the drawing which shows a circuit diagram thereof. These is a Wien bridge type oscillator 24 that includes a limiter 25 which maintains the output voltage from the oscillator at less than one volt. An output circuit from the oscillator goes via circuit connection 29 to one arm 30 of a ganged switch 31. When the switch 31 is in the position illustrated, the output circuit of oscillator 24 goes via the connection 29 and the switch arm 30 to another circuit connection 34 that goes to the plug or connector 20. From plug 20 there is a probe lead 35 which connects the probe 16 to the plug 20.

When flange resistance is being tested, the probe 16 will be placed into electrical contact with the flange 13 of pipe 11 and the insulator 15 is then in the series circuit between probe 16 and the other probe 17 that is in electrical contact with the flange 14 of pipe 12. The circuit continues via another probe lead 36 to the plug 21 from which a circuit connection 39 goes to another arm 40 of the ganged switched 31. From the arm 40 there is another circuit connection 41 which goes to an amplifier 42.

Amplifier 42 is a solid state type amplifier which includes a gain set feed back resistor 45 as well as a balance resistor 46. The other input to the amplifier 42 is connected to a common ground circuit 49 via a resistor 50.

There is an output circuit connection 53 from the amplifier 42 and it goes to an input of a precision rectifier 54. It will be understood by one skilled in the art that a precision rectifier such as the type illustrated, makes use of a diode 57 in the output, and the output is then fed back via a connection 58 to an input of the precision rectifier 54 which provides amplification so that the threshold voltage of the diode 57 is overcome. Consequently, a voltage close to zero on the input connection 53 will be rectified and appear on an output circuit 62 from the precision rectifier 54.

The output circuit 61 has a potentiometer 62 connected across it. Thus, the other side of the resistor of potentiometer 62 is connected to the common ground circuit 49. There is also a smoothing and surge limiting circuit connected across the output of the precision rectifier 54. It comprises a pair of diodes 65 and 66 with a capacitor 67 connected there across. Consequently, the smoothing and surge limiting circuit (made up of the capacitor 67 and the diodes 65 and 66) is connected in parallel with the potentiometer 62. Also, there is a microammeter 70 that is connected in parallel with the smoothing and surge limiting circuit, as well as in parallel with the potentiometer 62. It will be understood that this ammeter 70 indicates (by calibration thereof) the resistance between the pipe flanges 13 and 14 of the pipes 11 and 12.

The potentiometer 62 has an output circuit connection 74 that goes to a dual comparator circuit 75. The dual comparator circuit 75 includes a comparator 78 and another comparator 79, which each have one input connected to the output connection 74. It will be appreciated that an input connection 80 to comparator 78 coes to a negative, while an input connection 81 to comparator 79 goes to a positive. Also, an input connection 82 to the comparator 78 goes to a positive, similarly an input connection 83 to the comparator 79 goes to a negative thereof. The input connections 82 and 83 go from the adjustable connectors of resistors 86 and 87 respectively, and consequently they determine the amplitude of the settings for the high and low resistance readings which may be adjusted.

The dual comparator 75 also includes in its circuits a pair of light emitting diodes 90 and 91 which have green and red colors respectively, in order to provide indication of the low and high resistance at the pipe flanges being measured. It will be understood that the voltage changes being measured at the dual comparator, are inversely variable as the flange resistance. Consequently, the low voltage indicated by the green light emitting diode 90, indicates acceptably high resistance at the flanges. Conversely, the high voltage indication by the red light emitting diode 91, indicates unacceptably low resistance at the insulated flanges.

There is a third light emitting diode 92 which has a different color from either of the diodes 90 or 91. It is connected for indicating the middle range of signal amplitudes between the comparators 78 and 79. This diode 92 is preferably a yellow color which follows conventional indications of the colors used for indicating stop, go and caution. Thus, each light indicates one of three ranges of the resistance being measured at the pipe flanges.

It may be noted that the operation of the dual comparator 75 may be explained as follows. The signal input on connection 74 goes to the opposite inputs of comparators 78 and 79 via the input circuit connections 80 and 81 respectively. Then, if the signal (on connection 80) is greater than the other input to comparator 78 (determined by the setting of connection 82 on the resistor 86) the comparator 78 will provide an output signal that goes via a resistor 95 and a circuit connection 96 to a transistor 97. Transistor 97 controls the activation of the light emitting diode 91.

Similarly, if the signal input on connection 74 and connection 81 (to comparator 79) is less than the voltage determined by the setting of the connection 83 on the resistor 87, the comparator 79 will provide an output signal that goes via a resistor 100 and a circuit connection 101 to a transistor 102. Transistor 102 controls the activation of the light emitting diode 90 and thus indicates the resistance measurement at the flanges 13 and 14 of the pipes 11 and 12 to be in an acceptably high resistance range. As indicated above, this is because the voltage amplitude of the signals from potentiometer 62 is inversely related to the resistance at the pipe flanges.

In the intermediate range of signal amplitude on the input circuit connection 74, i.e., when the signal is less than that set by the upper input connection 82 on variable resistor 86, and more than the signal on the lower connection 83 of the resistor 87, neither comparator 78 nor 79 will provide an output signal. Under those conditions the circuit that controls activation of a transistor 105 will make it conduct and so activate the light emitting diode 92, which has a yellow color. it will be understood that the foregoing action takes place because the transistors 97 and 102 are both PNP type transistors while transistor 105 is an NPN transistor. By having a resistor 106 in the base circuit of transistor 105, when both comparators 78 and 79 are non-conducting, the base of transistor 105 is at the high voltage by reason of a circuit connection 107. Consequently, the transistor 105 will conduct and will activate the light emitting diode 92. However, when either comparator 78 or 79 is conducting, it will provide output current through the respective resistor 95 and 100 and depending upon which one conducts the respective transistor 97 or 102 will be made conducting and the corresponding light emitting diode will be activated in each case. When either of those comparators are conducting, it will draw current through the resistor 106 and the corresponding one of a pair of diodes 110 and 111 so that the transistor 105 will be cut off and the light emitting diode 92 will be extinguished.

It will be observed that there are three calibration resistors 112 that are connected to respective pairs of contactors of the ganged switch 31. It will be understood that these are precision resistors that are chosen so as to provide outputs that are in the desired ranges of the resistance measurements to be made by the probes 16 and 17 and the pipe flanges 13 and 14 of pipes 11 and 12. It will be noted that by placing the switch 31 in one of the settings for the individual resistors 112 a desired one thereof will be selected and it will act to provide a signal that is in one of the three desired ranges of output signals. Consequently, the instrument may be tested prior to any given use for pipe flange measurements, by moving the switch 31 to each of the three calibrated positions and observing the outputs as indicated by the light emitting diodes 90, 91 and 92 respectively.

While a particular embodiment of the invention has been described above in considerable detail, in accordance with the applicable statutes, this is not to be taken as in any way limiting the invention but merely as being descriptive thereof.

We claim:

1. A low voltage AC ohmeter for testing insulated pipe flanges in uses where flammable substances are handled comprising in combinations a low frequency oscillator comprised of a Wien bridge having a limiter for maintaining the output voltage thereof less than one volt maximum, probe circuit means for connecting said oscillator output in series with a pair of said pipe flanges to measure the resistance between said pipe flanges, an amplifier having an input in series with said oscillator output and said probe circuit means in having an output, a precision rectifier connected to said amplifier output, a potentiometer connected across the output of said precision rectifier, and dual comparator means connected to the output of said potentiometer and comprising a plurality of light emitting diodes, circuit means for selectively connecting said Wien bridge output in series with a calibration resistor whereby said dual comparator means can be checked for accuracy, a smoothing and surge limiting circuit connected across the output of said precision rectifier in parallel with said potentiometer, and a micro ammeter connected in parallel with said smoothing and surge limiting circuit for indicating the resistance between said pipe flanges.

2. A low voltage AC ohmeter for testing insulated pipe flanges in uses where flammable substances are handled, comprising in combination a Wien bridge type oscillator having a frequency of about 1200 hertz and a limiter for maintaining the output voltage thereof less than one volt, probe circuit means for connecting said oscillator output in series with a pair of said pipe flanges to measure the resistance between said pair of flanges, an amplifier having an input in series with said probe circuit means and an output, a precision rectifier connected to said amplifier output for reducing the threshold amplitude of rectified output signals, a potentiometer connected across the output of said precision rectifier, a smoothing and surge limiting circuit connected across the output of said precision rectifier in parallel with said potentiometer, a microammeter connected in parallel with said smoothing and surge limiting circuit for indicating the resistance between said pipe flanges, dual comparator means connected to said potentiometer, said dual comparator means comprises
   a pair of comparators,
   a pair of light emitting diodes having different colors,
   a first circuit means for connecting one of said light emitting diodes to each of said pair of comparators,
   a third light emitting diode having a color different from said pair of light emitting diodes, and
   second circuit means for connecting said third light emitting diode to both said comparators whereby said dual comparator means indicates one of three ranges of the resistance between said pipe flanges, three calibration resistors for providing predetermined resistances in place of said pair of pipe flanges, and circuit means for alternatively connecting one of said calibration resistors in place of said probe circuit means to test said dual comparator means including said light emitting diodes.

* * * * *